United States Patent [19]

Hsu et al.

[11] Patent Number: 5,700,711
[45] Date of Patent: Dec. 23, 1997

[54] METHOD OF MANUFACTURING AN SRAM LOAD SHIELD

[75] Inventors: Chen-Chung Hsu, Taichung; Tsun-Tsai Chang, Hsin-Chu, both of Taiwan; Larry Lin, Cupertino, Calif.

[73] Assignee: United Microelectronics Corporation, Hsin-Chu, Taiwan

[21] Appl. No.: 735,222

[22] Filed: Oct. 22, 1996

Related U.S. Application Data

[60] Provisional application No. 60/013,303, Mar. 7, 1996.
[51] Int. Cl.$^6$ ................................................ H01L 21/70
[52] U.S. Cl. ................................ 437/60; 437/47; 437/52; 437/918; 148/DIG. 136
[58] Field of Search ............................ 437/47, 52, 60, 437/918; 148/DIG. 136

[56] References Cited

U.S. PATENT DOCUMENTS

| | | |
|---|---|---|
| 4,948,747 | 8/1990 | Pfiester .............................. 437/47 |
| 5,068,201 | 11/1991 | Spinner, III et al. ............... 437/60 |
| 5,177,030 | 1/1993 | Lee et al. . |
| 5,196,233 | 3/1993 | Chan et al. ........................ 437/918 |
| 5,204,279 | 4/1993 | Chan et al. ........................ 437/47 |
| 5,470,779 | 11/1995 | Yoo ................................... 437/52 |
| 5,635,418 | 6/1997 | Roberts ............................. 437/47 |

*Primary Examiner*—Tuan H. Nguyen
*Attorney, Agent, or Firm*—William H. Wright

[57] ABSTRACT

A shield structure is formed over each of the undoped or lightly doped polysilicon load devices of a 4T SRAM cell. The shield structure may be a metal such as aluminum, titanium or tungsten and serves to protect the undoped or lightly doped resistor within a polysilicon load device from charge-induced damage during ion implantation or plasma processing steps performed on the SRAM after formation of the polysilicon load device. The polysilicon load device is defined by depositing a layer of photoresist, exposing the photoresist through a master load mask, etching, and implanting into the exposed polysilicon. After the load device is formed, a dielectric layer is deposited and then a layer of conductive material is deposited. Dummy conductor structures are formed from the layer of conductive material using photolithography and the master load mask.

16 Claims, 9 Drawing Sheets

METHOD OF MANUFACTURING AN SRAM LOAD SHIELD

This application claims priority from provisional application Ser. No. 60/013,303, filed Mar. 7, 1996.

BACKGROUND OF THE INVENTION

1. Field of the Invention

This invention relates to semiconductor devices and more particularly to polysilicon load devices and a method of manufacture thereof.

2. Description of the Related Art

A "4T" SRAM configuration includes four transistors and two load devices within each memory cell. Typically, the transistors are MOS field effect transistors and the load devices include polysilicon resistors that are undoped or lightly doped to provide a very high resistance. A polysilicon load device may be formed by first depositing a layer of polysilicon and blanket implanting the deposited layer. This blanket implantation provides a low level of dopant to the polysilicon that is sufficient to stabilize the otherwise unpredictable electrical properties of the polysilicon. A mask is provided on the polysilicon which covers the regions where load devices are to be formed. A heavier level of ion implantation is made to the exposed regions of the polysilicon, making the exposed regions highly conductive, and then photolithography is performed to define polysilicon wiring lines. Contacts are provided to connect the load devices in series between the power supply voltage and storage nodes within the memory cell, in the manner conventionally used in the 4T SRAM configuration.

Subsequent to the formation of the polysilicon load devices, the mask material is removed from above the lightly doped or undoped polysilicon regions of the load devices, and this lightly doped or undoped polysilicon region may be exposed to a variety of processing steps in the completion of the SRAM device. Such processing may include plasma etching. When a polysilicon load device is exposed to plasma etching or other plasma process, it is possible for the polysilicon load device to be damaged by charged particles within the plasma. This is particularly true when the plasma process includes an accelerating potential such as is used in plasma etching processes like reactive ion etching (RIE). Damage can occur through a layer of silicon oxide ($SiO_2$) covering the polysilicon load device. Charge damage to a polysilicon load device reduces the resistance of the polysilicon load by about 2 orders of magnitude from $10^{11}$ ohms to $10^9$ ohms, increasing the standby current of the SRAM device in a manner that can result in data loss. Such damage is a particular problem for low power, high speed SRAM devices where polysilicon loads may be exposed to RIE etching.

SUMMARY OF THE PREFERRED EMBODIMENTS

One aspect of the present invention is a method of making an SRAM device. The method of forming the SRAM device includes the steps of forming a polycrystalline silicon structure over a memory cell of the SRAM device, forming a load mask over the polycrystalline silicon structure covering a region where a load structure is to be formed, the load mask being patterned using a master load mask, and doping regions of the polycrystalline silicon structure not covered by the load mask. Then, a blanket dielectric layer is formed over the SRAM device covering the polycrystalline silicon structure and other exposed surfaces of the SRAM device. Next, a dummy conductor structure is formed on the blanket dielectric layer, so that the dummy conductor structure protects the polycrystalline silicon load resistor during subsequent processing steps.

In a more particular aspect of the present invention, the step of forming a dummy conductor consists of depositing a layer of a conductor material over the blanket dielectric layer, forming a dummy mask over the dummy conductor layer with the master load mask, and etching away the portions of the dummy conductor layer unprotected by the dummy mask.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENTS

Particularly preferred embodiments of the present invention form a dummy conductor structure above the undoped or lightly doped region of polysilicon load devices in SRAMs. Most preferably, this dummy conductor structure is formed above the polysilicon load devices by depositing a layer of conductive material and then patterning the layer of conductive material using the same mask used to define the polysilicon load devices. The conductive structures formed in this way have the same size and overlie the undoped or lightly doped region of the polysilicon load devices. The conductive material may, for example, be a metal such as aluminum, tungsten or titanium.

Dummy conductor structures in accordance with the present invention protect the undoped or lightly doped regions of polysilicon load devices during subsequent plasma processing steps. The conductor shields the polysilicon load device from damage by the ionized particles of a plasma etching or deposition process, preventing an undesirable reduction in the resistance of the polysilicon load devices during the plasma processing steps performed in the completion of the SRAM device. By making dummy conductor structures in accordance with the present invention, no additional masks need be provided, reducing the possibility of mask errors. A method for manufacturing a dummy conductor in accordance with the present invention is now described.

Figure 1:
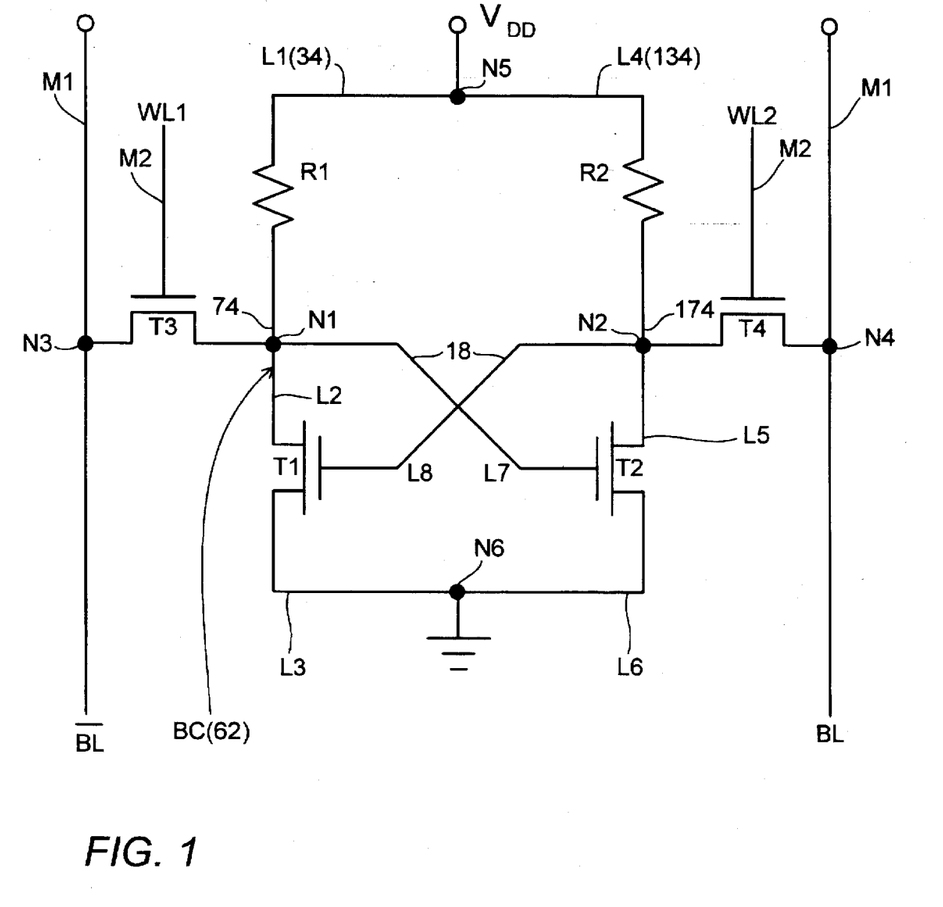
FIG. 1 schematically illustrates an SRAM cell.

FIG. 1 is a schematic of a 4T (four transistor) SRAM cell including storage transistors T1 and T2 and transfer transistors T3 and T4. Storage transistors T1 and T2 are connected in series between nodes N1 and N2, with the drain of each transistor coupled to a corresponding node N1, N2 and with the gates of transistors T1 and T2 coupled to the drain of the opposite transistor T2, T1. Transfer transistor T2 couples node N1 to bitline $\overline{BL}$ at node N3 and transfer transistor T4 couples node N2 to the other bitline BL at node N4. The gates of transistors T3 and T4 are connected to wordlines WL1 and WL2 respectively so that the transfer of charge from the storage nodes to the bitlines is controlled by the signals provided to the word lines.

The drain and source of transistor T1 are connected via lines L2 and L3 between node N1 and through node N4 to ground. Line L8 (conductor layer 18 in FIGS. 4-16) connects the gate of transistor T1 to node N2. The drain and source of transistor T2 are connected via lines L5 and L6 between node N2 and through node N4 to ground. Line L7 (conductor layer 18) connects the gate of transistor T2 to node N1. The voltage source $V_{DD}$ is connected through node N5 and respectively through lines L1 (34) and L4 (134) to load devices R1 and R2 which are connected respectively at their opposite ends through lines 74 and 174 to node N1 and node N2. Bit lines BL and $\overline{BL}$ are formed by metallization line M1 and word lines WL1 and WL2 are formed by metallization M2. A buried contact BC (bilayer stack 62 in FIGS. 7-15) is located between node N1 and the drain of transistor T1. The load device K1 is formed of layer K1 seen in FIGS. 12-16. Conductor line 74 is connected between the buffed contact BC(62) and the load device R1 formed from layer 34.

Figure 2:
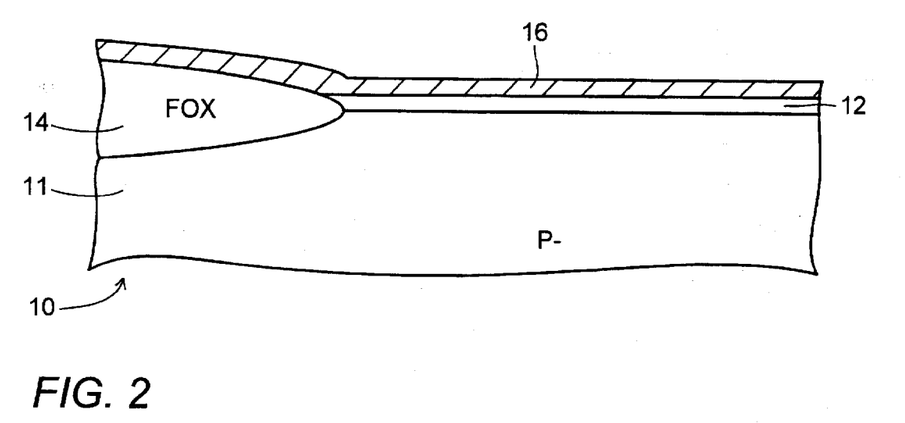
FIGS. 2–16 illustrate steps in the formation of an SRAM device in accordance with a preferred embodiment of the present invention.
Figure 17:
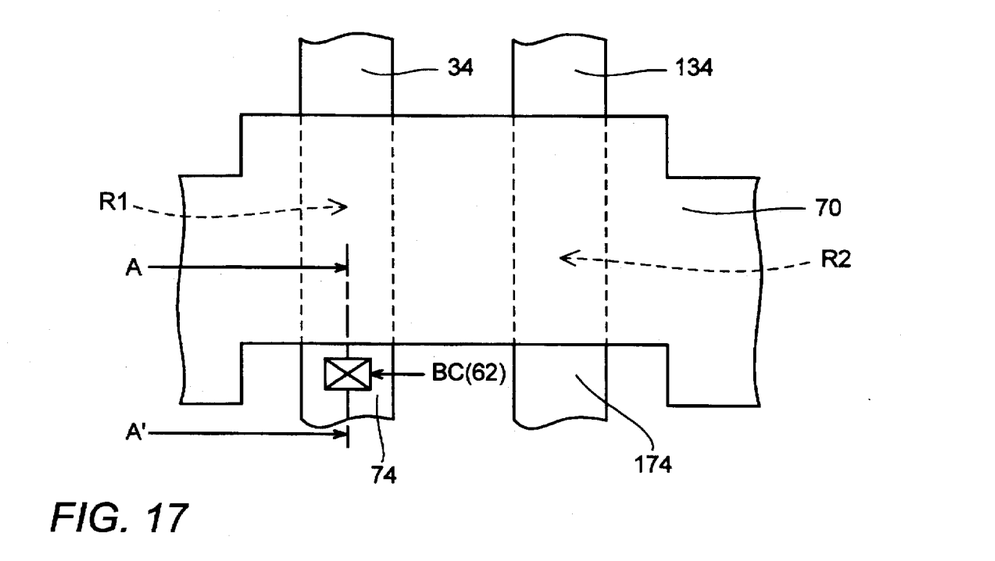
FIG. 17 is a plan view of a portion of an SRAM cell.

FIG. 2 shows a sectional elevation view taken along line A-A' in FIG. 17 of the buffed contact region BC(62) of an SRAM cell in accordance with this invention in an early stage of the process of manufacture. FIG. 2 shows a portion of the SRAM cell shown in FIG. 1. In FIG. 2, a lightly doped silicon, P-type substrate 11 is covered with a thin gate oxide layer between about 100 Å and about 300 Å thick on the right portion of the surface of substrate 11 and a thick silicon oxide layer conventionally referred to as a field oxide (FOX) region 14 covers the left portion of the surface of substrate 11. The gate oxide and the FOX region are formed in accordance with conventional processing techniques. A layer 16 of polycrystalline silicon is deposited on the surface of the FOX region 14 and the gate oxide layer 12. The first portion 16 of the first polysilicon layer preferably has a thickness of about 800 Å with a range of acceptable thickness of between about 500 Å and about 1,000 Å.

Figure 3:
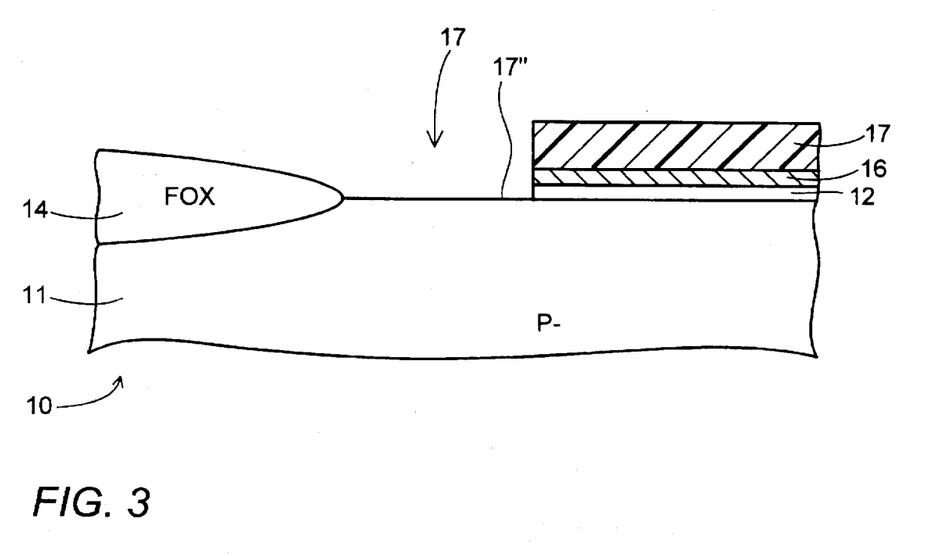
Figure 4:
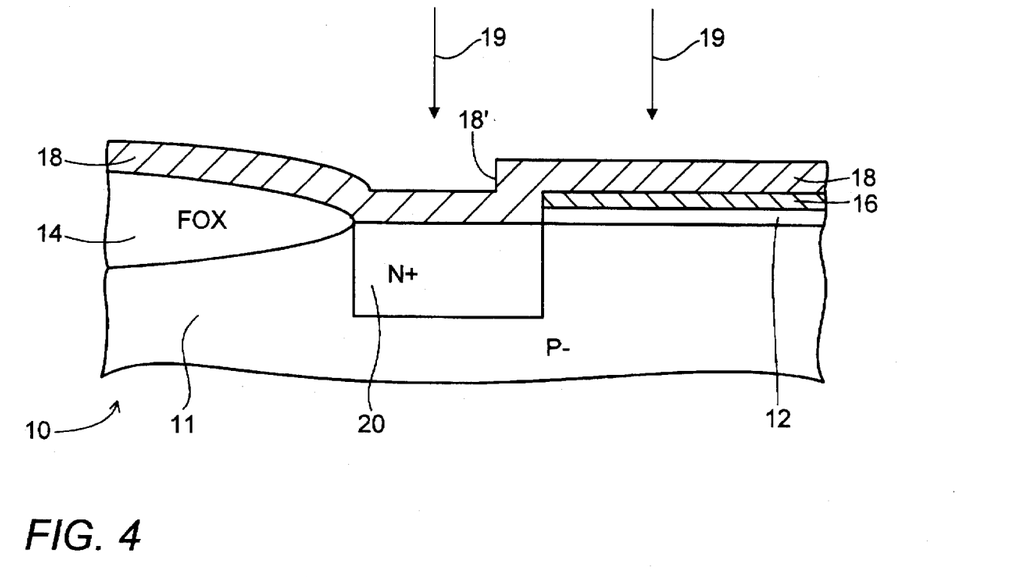

FIG. 3 shows the device 10 of FIG. 2 after a first polysilicon mask 17 has been formed over the right side of the device 10 to the right of the FOX region 14 leaving an opening 17' on the left side of device 10. The exposed portion of the first portion 16 of the first polysilicon layer is then etched away where it is exposed and then etching the exposed portion of the gate oxide layer 12 beneath opening 17', leaving an area 17" of the uppermost surface of substrate 11 exposed. FIG. 4 shows the device 10 of FIG. 3 after a blanket layer 18 of polycrystalline silicon, referred to hereinafter as the second portion 18 of the first polysilicon layer, has been deposited on the surface of the FOX region 14 and the first portion 16 of the first polysilicon layer. The second portion 18 of the first polysilicon layer preferably has a thickness with a range of between about 500 Å and about 1,500 Å. An edge 18' extends above the area 17" where the second portion 18 extends over the first portion 16 of the first polysilicon layer and extending down to the surface of the substrate.

After deposition of polysilicon layer 18, a self-aligned ion implantation of phosphorus ions 19 is made at an energy of about 30 KeV with a dose of about $8 \times 10^{15}$ ions/cm$^2$ to form a latent buried contact N+ region 20 in the substrate 11 between the FOX region 14 and the edge 18' of stacked first polysilicon layers 16 and 18. The combined thick FOX region 14 on the left and the laminated layers 16 and 18 on the right together define the extent of the implantation 20. The location of the right edge of region 20 is determined where the first and second portions 16 and 18 of the first polysilicon layer have a combined thickness of between about 1,000 Å and about 2,500 Å is sufficient to block the implantation of N+ ions into substrate 11. The device 10 is then heated to convert region 20 into a buried contact.

Figure 5:
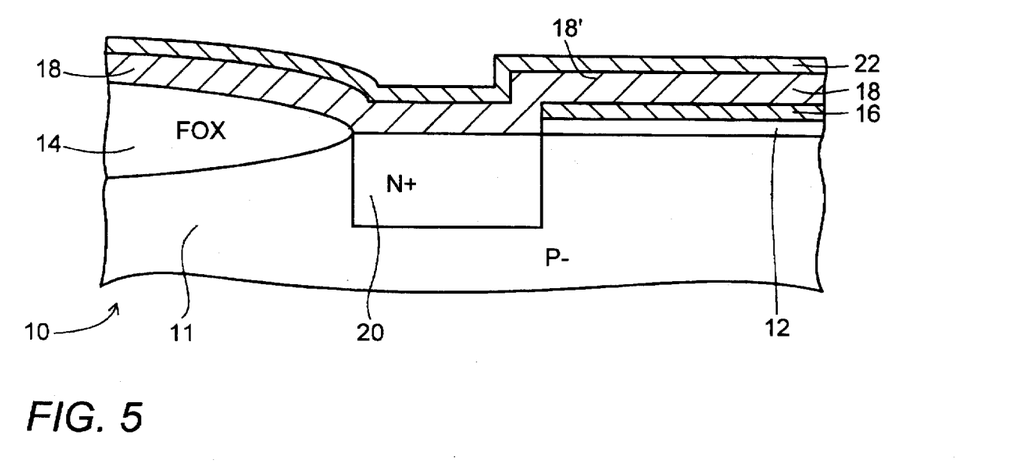
Figure 6:
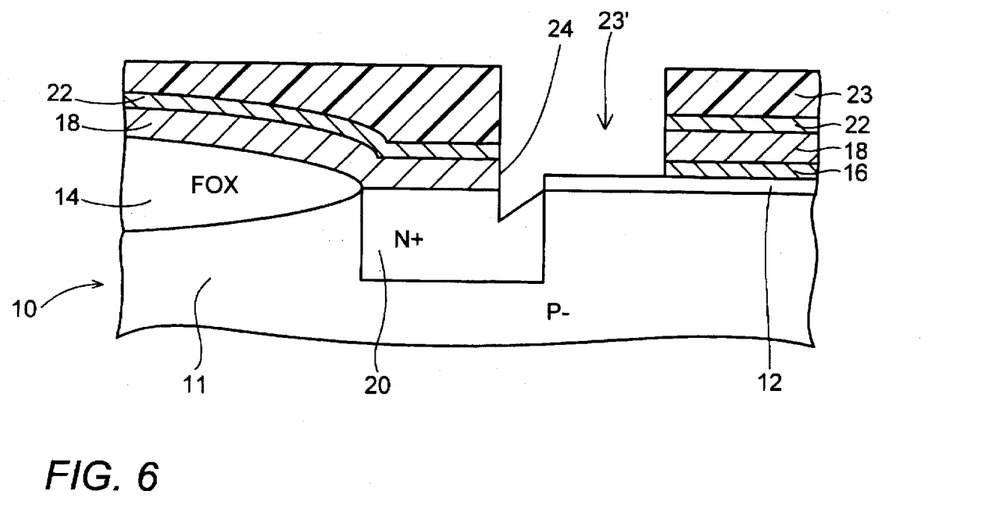

FIG. 5 shows the device 10 of FIG. 4 with a layer of polycide such as tungsten silicide ($WSi_x$) deposited to a thickness of between about 1000 Å and about 2000 Å over the second portion 18 of the first polysilicon layer. The preferred method of deposition of the tungsten silicide layer is low power chemical vapor deposition (LPCVD). FIG. 6 shows the device of FIG. 5 after a mask 23 has been formed over the device with an opening 23' over the right side of contact region 20 and extending to the right thereof exposing the edge 18' and a substantial portion of the stacked layers 16 and 18. Then, the exposed portions of the polycide layer 22, second portion 18 and first portion 16 of the first polysilicon layer are etched away using a dry etching process such as RIE. Note that the portions of the silicon substrate 11 left without the protection of gate oxide layer 12 are also etched by the dry etching process. A sloped etched region 24 is formed on the surface of silicon substrate 11 during the etching of polysilicon layers 16 and 18.

Figure 7:
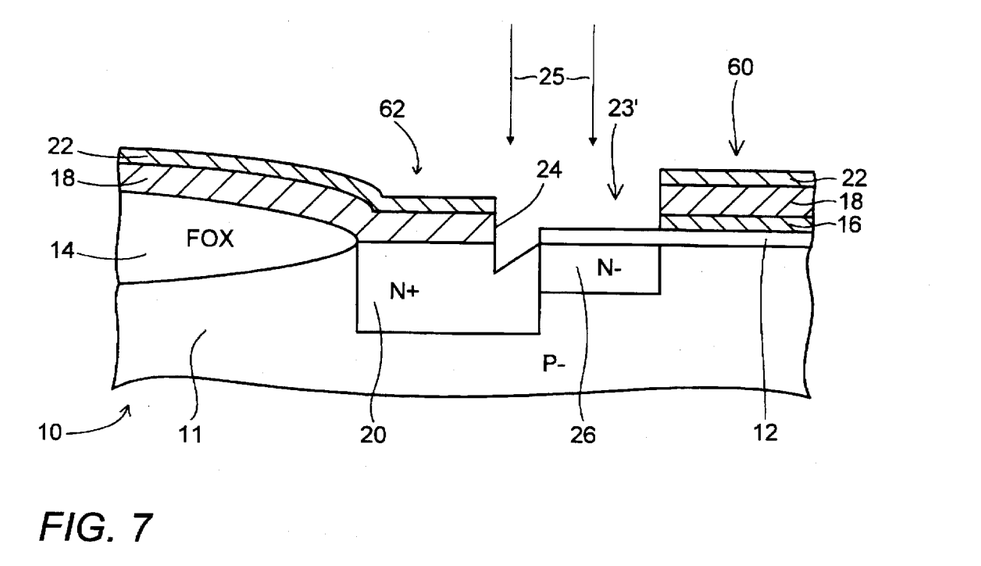
Figure 8:
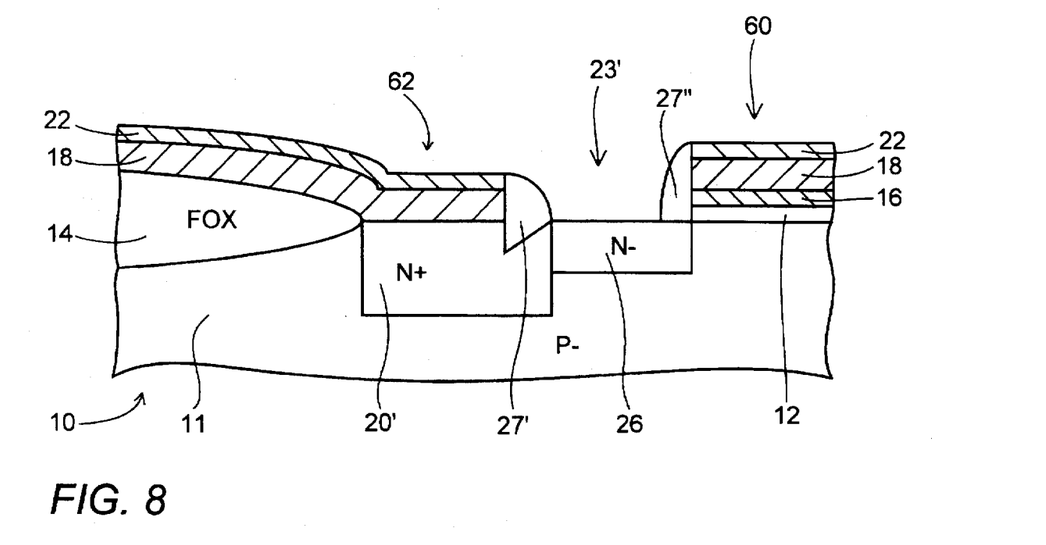

As shown in FIG. 8, phosphorus ions 25 are implanted into an LDD (Lightly Doped Drain) region 26 to the right of contact region 20 at an energy of between about 30 KeV and about 80 KeV with a dose of between about $1 \times 10^{13}$ ions/cm$^2$ and about $1 \times 10^{14}$ ions/cm$^2$. The LDD region 26 is self-aligned with the edge of the trilayer conductor stack 60 of layers 16, 18 and 22 to the right of opening 23'. After the LDD region 26 is formed, the device of FIG. 7 is coated with a conventional blanket silicon dioxide spacer layer (comprising a second dielectric layer) to a thickness of about 1500 Å by a CVD process, producing the structure shown in FIG. 8. The spacer layer is etched back isotropically to form the left silicon dioxide, dielectric spacer 27' at the edge of the bilayer stack 62 (of layers 18 and 22) and the right silicon dioxide dielectric spacer 27" at the edge of trilayer stack 60 using the well known process. The spacer 27' fills the opening 24 formed on the surface of the substrate at the N+ region 20.

Figure 9:
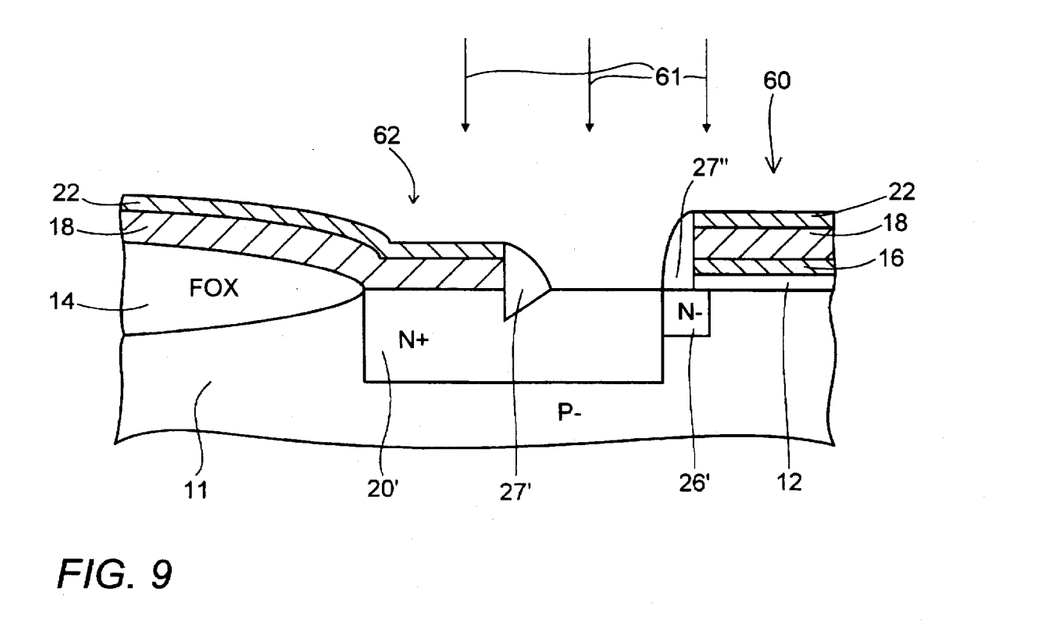
Figure 10:
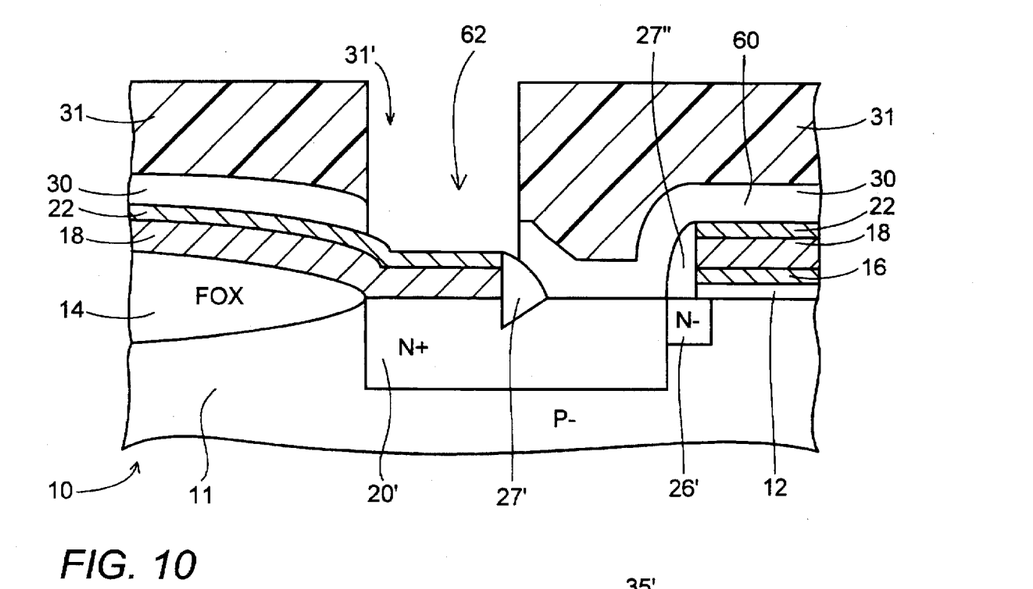
Figure 11:
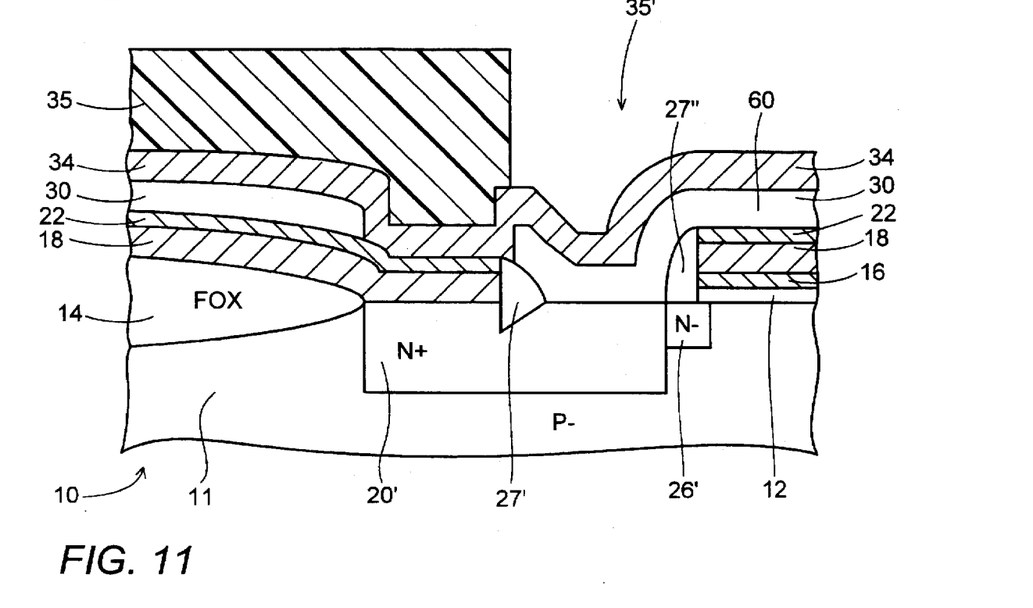

FIG. 9 shows the implantation of arsenic ions 61 into a drain implantation 26 formed in contact with the buried contact region 20. The implantation is performed at an energy of between about 50 KeV and about 100 KeV with a dose of between about $1 \times 10^{15}$ ions/cm$^2$ and about $1 \times 10^{16}$ ions/cm$^2$, extending the buffed contact N+ region 20 to the drain of the adjacent transistor. FIG. 10 shows the device 10 of FIG. 9 after formation of a blanket glass layer 30 of APCVD (atmospheric pressure CVD) silicon dioxide ($SiO_2$) having a thickness of between about 1,000 Å and about 3,000 Å as a dielectric layer over polycide layer 18 and over the exposed portions of contact region 20' and spacers 27' and 27". The glass layer 30 is then covered with a photoresist mask 31 having a polysilicon via opening 31'. Opening 31' is located above contact stack 62 with the left edge aligned above the right end of FOX region 14 and the right side of opening 31' centered over spacer 27'. The glass layer 30 is etched away where exposed through opening 31'. The mask 31 is then removed and an undoped second layer of polysilicon 34 is deposited to a thickness of between about 500 Å and about 1,000 Å. The polysilicon layer 34 contacts the surface of polycide layer 22 through the opening in glass layer 30. A mask 35 is then formed over the second layer 34 of polysilicon and then etching is performed to remove unwanted portions of polysilicon layer 34.

Figure 12:
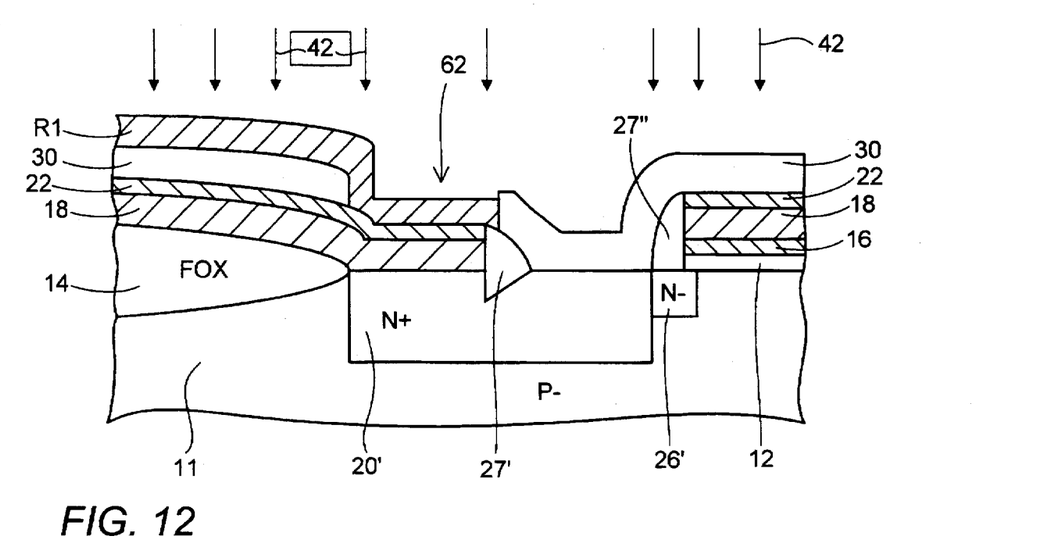

Next, referring to FIG. 12, a blanket ion implantation of phosphorus ions 42 at a preferred energy of 30 KeV within a range of energies of between about 10 KeV and about 50 KeV and to a preferred dose of $1 \times 10^{14}$ ions/cm$^2$ within a range of doses of between about $1 \times 10^{13}$ ions/cm$^2$ and about $1 \times 10^{15}$ ions/cm$^2$ is performed. This light implantation preferably converts the entire second polysilicon layer 34 into a layer of polysilicon having a uniformly high resistance. Such a light implantation is preferred when portions of the polysilicon layer are to be used as resistive portion of a load device, because such an implantation tends to increase the resistance of the polysilicon and gives the polysilicon more predictable and reliable electrical properties. A photoresist load mask 70 (FIG. 13) is formed over a portion of the polysilicon to be formed into the polysilicon load device R1 on the left above the FOX region 14, leaving the remainder of polysilicon layer exposed. The load mask 70 is formed by exposing a layer of photoresist through a master load mask. A conductor implant of arsenic ion at a preferred energy of 60 KeV within a range of energies of between about 30 KeV and about 100 KeV and to a preferred dose of $5 \times 10^{15}$ ions/cm$^2$ within a range of doses of between about $1 \times 10^{15}$ ions/cm$^2$ and about $1 \times 10^{16}$ ions/cm$^2$. The implantation dopes the exposed portions of polysilicon layer (i.e., other than the load device R1) to convert it into a highly doped conductor line 74 which connects to the buried contact 20' through the contact stack 62. FIG. 14 shows the device 10 of FIG. 13 after deposition of a second blanket glass layer 46 providing a fourth dielectric layer on device 10. Layer 46 comprises silicon dioxide glass (SiO$_2$) formed by APCVD having a thickness of between about 1,000 Å and about 1,500 Å.

Figure 13:
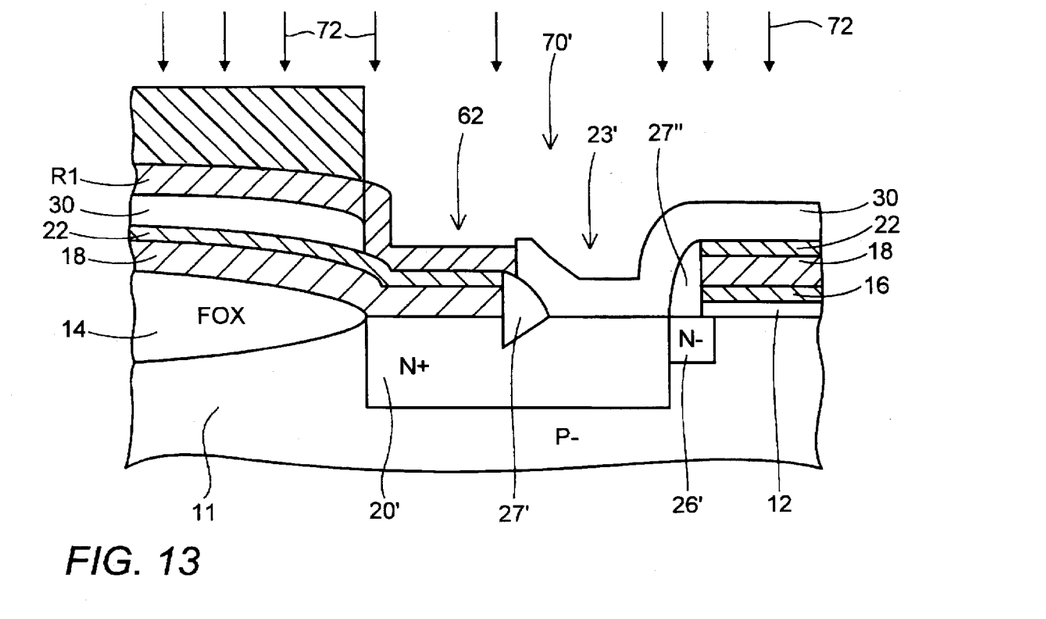
Figure 14:
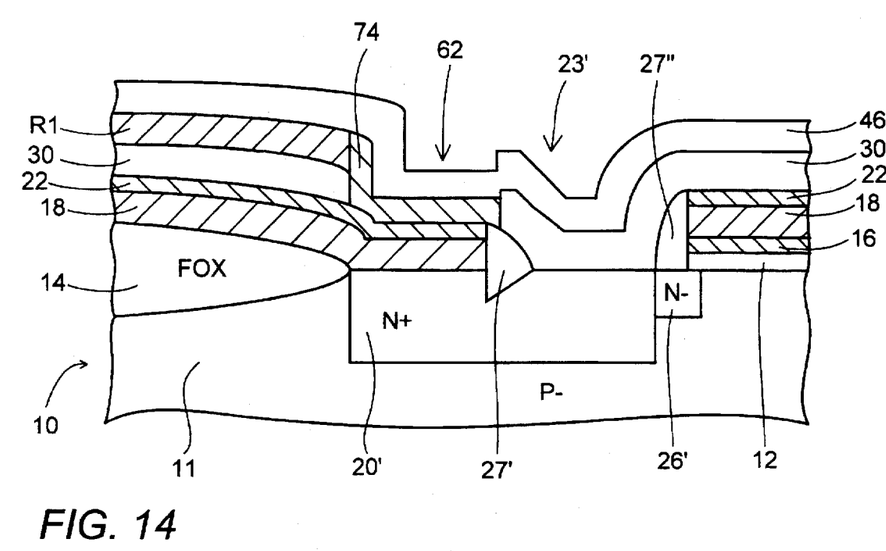
Figure 15:
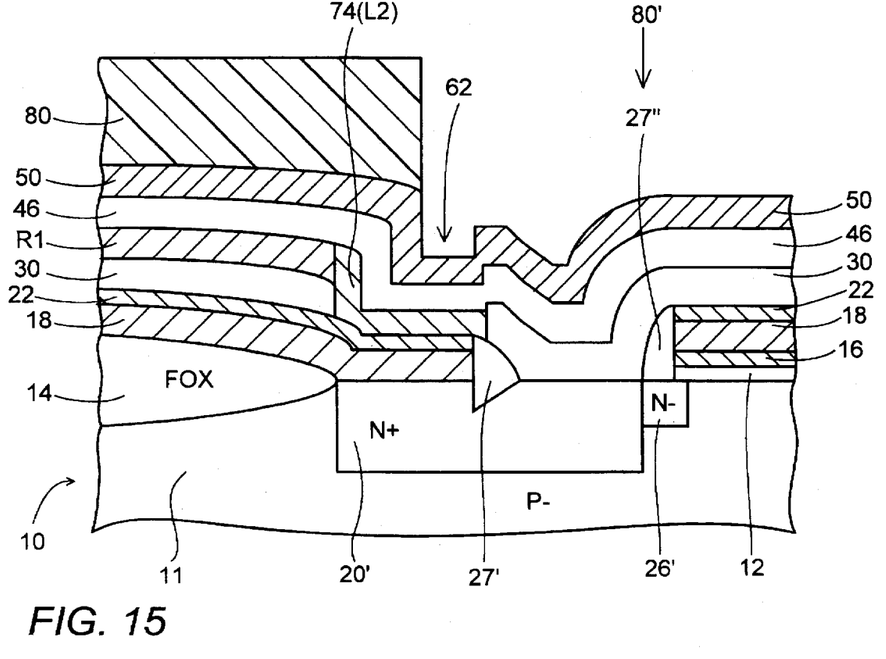
Figure 16:
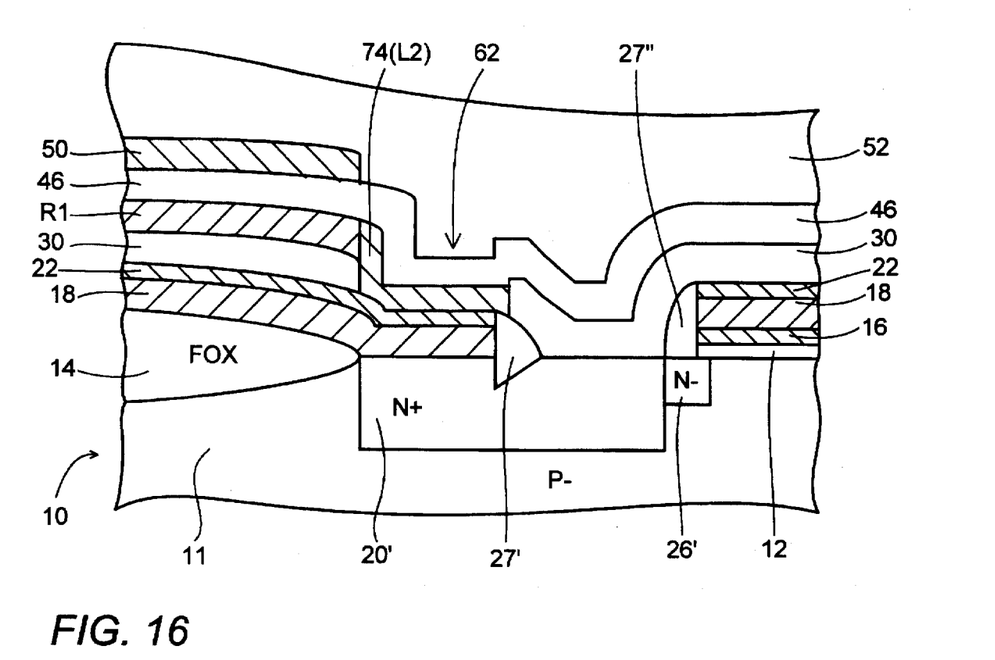

FIG. 15 shows the device of FIG. 14 after a conductive metal dummy load layer 50, preferably composed of titanium (Ti), tungsten (W) or aluminum (Al) has been deposited upon the exposed surface of the second glass layer 46. Preferably, the conductive metal dummy load layer 50 is deposited by sputtering to a thickness of between about 300 Å and about 500 Å. A photoresist layer 80 is deposited upon device 10 and exposed through the same master load mask used to expose the mask 70 in FIG. 13. When layer 80 is developed, an opening 80' is provided therein, preferably aligned over the lightly doped or undoped portion of the polysilicon load device R1. Then the metal layer 50 is plasma etched where it is exposed through the opening 80' in the mask 80 to form a dummy or floating conductor structure 50. In preferred embodiments, the dummy conductor structure is not subsequently connected electrically to any structures within the SRAM device. The dummy conductor structure 50 protects the polysilicon load device R1 from damage during subsequent processing. Patterning the dummy conductor structure 50 in this manner allows for subsequent processing steps to be performed in precisely the same manner as is performed in conventional SRAM devices. This is true because the dummy conductor structure 50 is the same size and is aligned to the undoped or lightly doped polysilicon load device, the region that most likely will benefit from protection during subsequent processing steps, including both plasma processing and ion implantation steps. FIG. 16 shows the device 10 of FIG. 15 after mask 80 has been stripped away and a layer 52 of BPSG (BoroPhosphoSilicate Glass) has been formed over the dummy metal layer 50 and the glass dielectric layer 46 and the BPSG layer 52 has been reflowed in the conventional manner.

FIG. 17 shows a plan view of the device 10 at the stage of the process shown in FIG. 13, with section line A–A' indicating the section line for FIGS. 2–16. Line 74 connects to the lower end of the load device R1 as seen in FIG. 1 and FIGS. 12–16. Line 34 connects to the upper end of load device R1 and lines 134 and 174 connect to opposite ends of the load device R2 as seen in FIG. 1. The mask 70 comprises the mask which is used in protecting the load devices during the doping of lines 34, 74, 134 and 174 as shown in FIG. 13. Conventional back end processing steps follow, including metallization, passivation and other high speed SRAM processing steps. In the metallization process, the conductive lines M1 and M2 shown in FIG. 1 are patterned using plasma etching. During the plasma etching to form conductive lines M1 and M2, the load devices R1 and R2 are protected from charge-induced damage by the overlying and aligned dummy conductor structures.

While this invention has been described in terms of the above specific embodiments, those skilled in the art will recognize that the invention can be practiced with modifications within the spirit and scope of the appended claims, i.e., that changes can be made in form and detail, without departing from the spirit and scope of the invention. Accordingly all such changes come within the purview of the present invention and the invention encompasses the subject matter of the claims which follow.

What is claimed is:

1. A method of forming an SRAM device, including the steps of:

forming a polycrystalline silicon structure over a memory cell of the SRAM device;

forming a load mask over the polycrystalline silicon structure covering a region where a load structure is to be formed, the load mask being patterned using a master load mask;

doping regions of the polycrystalline silicon structure not covered by the load mask;

forming a blanket dielectric layer over the SRAM device covering the polycrystalline silicon structure and other exposed surfaces of the SRAM device; and forming a dummy conductor structure on the blanket dielectric layer, whereby the dummy conductor structure protects the polycrystalline silicon load resistor during subsequent processing steps.

2. The method of claim 1, wherein the step of forming a dummy conductor consists of:

depositing a layer of a conductor material over the blanket dielectric layer;

forming a dummy mask over the dummy conductor layer with the master load mask; and etching away the portions of the dummy conductor layer unprotected by the dummy mask.

3. The method of claim 1, further comprising the step of forming metallization structures upon the SRAM device by depositing a blanket metal layer and then masking the blanket metal layer with a metallization mask having openings therein and etching the blanket metal layer through the openings in the metallization mask.

4. The method of claim 1, wherein the dummy conductor layer comprises a metal selected from the group consisting of titanium, aluminum and tungsten.

5. The method of claim 1, wherein the dummy conductor layer has a thickness between about 300 Å and about 500 Å.

6. The method of claim 4, wherein the dummy conductor layer has a thickness between about 300 Å and about 500 Å.

7. The method of claim 1, wherein the dummy conductor structure comprises a metal layer formed by sputtering a metal comprising titanium, aluminum or tungsten, and the blanket dielectric layer comprises an oxide of silicon having a thickness between about 1,000 Å and about 1,500 Å.

8. The method of claim 1, further comprising the step of forming an insulating layer above the dummy conductor structure, electrically isolating the dummy conductor structure from other portions of the SRAM device.

9. The method of claim 1, wherein the dummy conductor structure has the same shape and size as the load structure.

10. The method of claim 9, wherein the dummy conductor structure is aligned with the load structure.

11. The method of claim 10, wherein the dummy conductor structure is separated from the load structure by a layer of silicon oxide.

12. The method of claim 1, wherein the dummy conductor structure is formed above a field oxide region of the SRAM device.

13. The method of claim 12, wherein the load structure is formed adjacent a buried contact structure within the SRAM memory cell.

14. The method of claim 1, wherein the polycrystalline structure is deposited undoped.

15. The method of claim 14, wherein the polycrystalline structure is lightly doped subsequent to deposition and before the formation of the load mask.

16. The method of claim 1, wherein the dummy conductor structure lies over a portion of the polycrystalline silicon structure doped to a first level and wherein portions of the polycrystalline silicon structure displaced laterally away from the dummy conductor structure are doped to a second, higher level.

* * * * *